United States Patent
Yoshimura et al.

(10) Patent No.: US 10,317,451 B2
(45) Date of Patent: Jun. 11, 2019

(54) METHOD AND APPARATUS FOR DETECTING PARTIAL DISCHARGE WITHIN ELECTRICAL EQUIPMENT

(71) Applicant: MITSUBISHI ELECTRIC CORPORATION, Chiyoda-ku (JP)

(72) Inventors: Manabu Yoshimura, Chiyoda-ku (JP); Tatsuya Yabe, Chiyoda-ku (JP); Takashi Ito, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 516 days.

(21) Appl. No.: 14/763,561

(22) PCT Filed: Nov. 21, 2013

(86) PCT No.: PCT/JP2013/081355
§ 371 (c)(1),
(2) Date: Jul. 27, 2015

(87) PCT Pub. No.: WO2014/174713
PCT Pub. Date: Oct. 30, 2014

(65) Prior Publication Data
US 2015/0355256 A1    Dec. 10, 2015

(30) Foreign Application Priority Data

Apr. 22, 2013  (JP) ................... 2013-089228

(51) Int. Cl.
*G01R 31/02* (2006.01)
*G01R 31/12* (2006.01)
(Continued)

(52) U.S. Cl.
CPC ......... *G01R 31/02* (2013.01); *G01R 31/1254* (2013.01); *G01R 31/44* (2013.01); *H02B 13/065* (2013.01)

(58) Field of Classification Search
CPC ............ G01R 31/1254; G01R 31/1272; G01R 31/1227; G01R 31/12
See application file for complete search history.

(56) References Cited

U.S. PATENT DOCUMENTS 6,445,189 B1 * 9/2002 Pakonen ............. G01R 31/025
324/523
6,507,181 B1 * 1/2003 Pakonen ................ G01R 31/12
324/536
(Continued)

FOREIGN PATENT DOCUMENTS

CN        101044410 A      9/2007
CN        102353877 A      2/2012
(Continued)

OTHER PUBLICATIONS

International Search Report dated Feb. 25, 2014 in PCT/JP2013/081355 filed Nov. 21, 2013.
(Continued)

*Primary Examiner* — Son T Le
*Assistant Examiner* — Adam S Clarke
(74) *Attorney, Agent, or Firm* — Oblon, McClelland, Maier & Neustadt, L.L.P.

(57) ABSTRACT

A partial discharge detection apparatus detects a plurality of discharge events, finds a time interval between the plurality of discharge events, and determines, where the discharge events occur at a time interval shorter than a threshold time, that a partial discharge has occurred within a metal enclosure, or determines, where the discharge events occur only at a time interval longer than the threshold time, that a discharge has occurred outside the metal enclosure. The partial discharge detection apparatus can thus readily distinguish between a partial discharge that occurs within the
(Continued)

metal enclosure of a gas-insulated switchgear and a discharge that occurs outside the metal enclosure.

12 Claims, 8 Drawing Sheets

(51) Int. Cl.
*G01R 31/44* (2006.01)
*H02B 13/065* (2006.01)

(56) References Cited

U.S. PATENT DOCUMENTS

| | | | | |
|---|---|---|---|---|
| 8,843,349 B2* | 9/2014 | Kang | ............... | G01R 31/1254 324/536 |
| 2002/0163344 A1* | 11/2002 | Rokunohe | .......... | G01R 31/1254 324/551 |
| 2006/0049831 A1* | 3/2006 | Anwar | ............... | G01R 31/1254 324/536 |
| 2007/0139056 A1 | 6/2007 | Kaneiwa et al. | | |
| 2010/0045305 A1* | 2/2010 | Fuhrmann | .......... | G01R 31/1218 324/551 |
| 2013/0191050 A1* | 7/2013 | Juge | ..................... | G01R 31/085 702/59 |

FOREIGN PATENT DOCUMENTS

| | | | | |
|---|---|---|---|---|
| JP | 2-147970 | A | | 6/1990 |
| JP | 02147970 | A | * | 6/1990 |
| JP | 3-249588 | A | | 11/1991 |
| JP | 10-26650 | A | | 1/1998 |
| JP | 10026650 | A | * | 1/1998 |
| JP | 11-271385 | A | | 10/1999 |
| JP | 2001-74802 | A | | 3/2001 |
| JP | 2003-23710 | A | | 1/2003 |
| JP | 2005-156452 | A | | 6/2005 |
| JP | 2008-215865 | A | | 9/2008 |

OTHER PUBLICATIONS

Office Action dated Jul. 5, 2016 in Japanese Patent Application No. 2015-513484 (with English-language translation).
Office Action dated Jan. 31, 2017 in Japanese Patent Application No. 2015-513484 (with English-language translation).
Office Action dated Oct. 20, 2017 in Chinese Patent Application No. 201380075578.7 (with English language translation).
British Office Action issued Application No. GB 1513968 6 dated Jun. 15, 2017.
Combined Chinese Office Action and Search Report dated Mar. 3, 2017 in Patent Application No. 201380075578.7 (with partial English translation and English translation of categories of cited documents).

\* cited by examiner

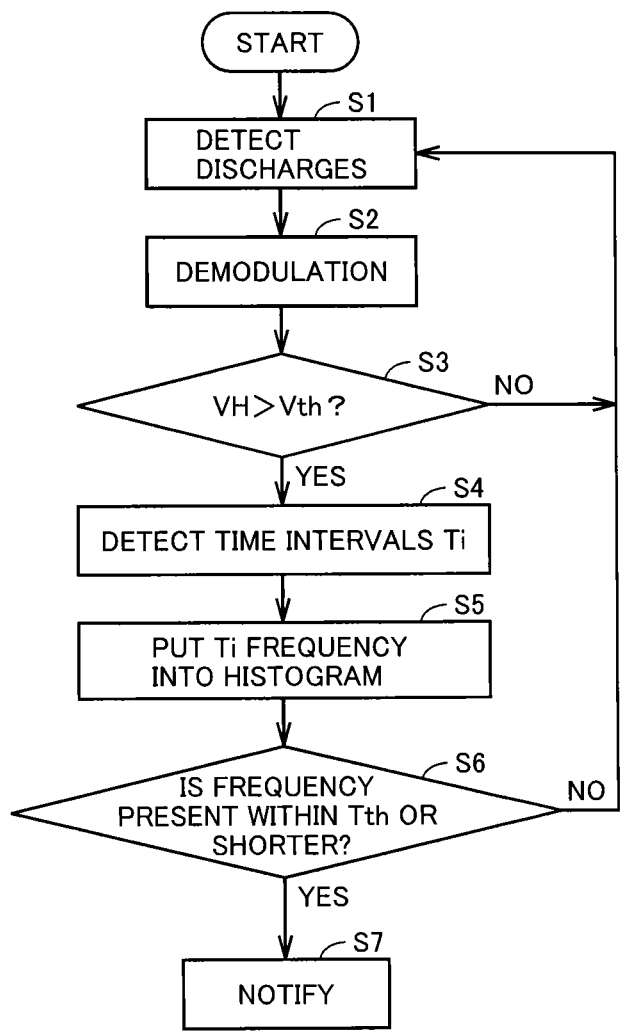

FIG.9A
IN SF6
FIG.9B
IN ATMOSPHERE
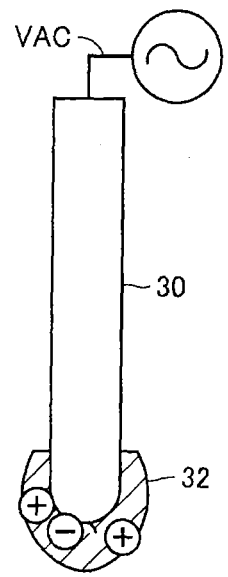
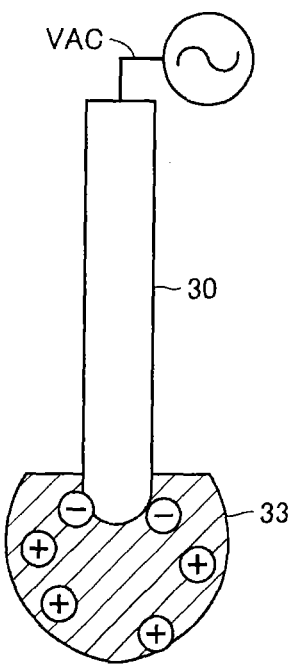
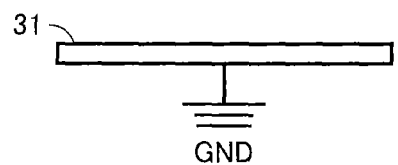
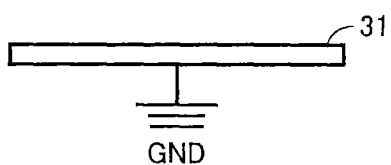

METHOD AND APPARATUS FOR DETECTING PARTIAL DISCHARGE WITHIN ELECTRICAL EQUIPMENT

TECHNICAL FIELD

This invention relates to a method and an apparatus for detecting a partial discharge within electrical equipment, and specifically to a method and an apparatus for detecting a partial discharge within electrical equipment in which a conductor is provided within a metal enclosure filled with an insulating gas, and a high voltage is applied between the conductor and the metal enclosure, wherein the method and the apparatus detect a partial discharge within the metal enclosure.

BACKGROUND ART

Electrical equipment such as gas insulated switchgears is generally configured to house a high-voltage portion within a grounded metal enclosure so that it can ensure safety against access from the outside. In such electrical equipment, the high-voltage portion and the ground portion are insulated from each other with a solid insulator or an insulating gas.

The insulation performance may, however, deteriorate, which can lead to a breakdown, in cases where metal particle is included in the metal enclosure for some reason, the solid insulator deteriorates due to a high-voltage stress, a protrusion is formed that may cause electric field concentration in the high-voltage portion, and a floating electrode that develops a floating potential is formed. Thus, in order to obviate a breakdown in the electrical equipment to improve reliability, it is important to detect a partial discharge that is a sign of deterioration of the insulation performance.

Japanese Patent Laying-Open No. 10-26650 (PTD 1), for example, discloses a partial discharge diagnosis method that includes determining, where two peaks arise in a frequency distribution of time intervals of partial discharge pulses, that conductive foreign matter is producing a firefly, with a high risk of breakdown. The peaks in the frequency distribution occur in a range of 0 to 40 μs and a range of 40 μs or longer. The term "firefly" refers to motion of the conductive foreign matter in the form of a vertical protrusion on the high-voltage portion.

Further, when detecting a partial discharge, it is necessary to distinguish between a partial discharge within the electrical equipment and electromagnetic noise caused by an electrical discharge occurring outside the electrical equipment. The electromagnetic noise caused by the discharge may be generated, for example, at the shield portion of a bushing end through which current is introduced from an overhead wire into the electrical equipment, or over the insulator surface of the overhead wire. Since this electromagnetic noise is similar in frequency spectrum to the discharge within the electrical equipment, it is not readily distinguishable from the discharge by using conventional techniques.

Japanese Patent Laying-Open No. 2005-156452 (PTD 2), for example, discloses a method for distinguishing between a partial discharge within electrical equipment and external noise, by creating a correlation diagram between the voltage phase angle of a particular partial discharge and the time interval to the subsequent occurrence of a partial discharge, and distinguishing between them based on the pattern of the correlation diagram.

CITATION LIST

Patent Document

PTD 1: Japanese Patent Laying-Open No. 10-26650
PTD 2: Japanese Patent Laying-Open No. 2005-156452

SUMMARY OF INVENTION

Technical Problem

Even though PTD 1 allows detection of the firefly of the conductive foreign matter, it cannot distinguish between a partial discharge and external noise.

In PTD 2, the method of distinguishing is complicated in that a correlation diagram between the voltage phase angle of a particular partial discharge and the time interval to the subsequent occurrence of a partial discharge is created, and, based on the pattern of the correlation diagram, a partial discharge within the electrical equipment and external noise are distinguished from each other. Further, PTD 2 does not disclose a means for discriminating between a partial discharge and noise using the correlation diagram, nor does it disclose a means for discriminating between a partial discharge and noise using the time interval between discharges.

Accordingly, a main object of this invention is to provide a method and an apparatus for detecting a partial discharge within electrical equipment that can readily distinguish between a partial discharge that occurs in the electrical equipment and a discharge that occurs outside the electrical equipment.

Solution to Problem

A method for detecting a partial discharge within electrical equipment according to this invention is a method for detecting a partial discharge within electrical equipment in which a conductor is provided within a metal enclosure filled with an insulating gas, and an AC high voltage of a frequency not higher than a utility frequency is applied between the conductor and the metal enclosure, the method detecting a partial discharge within the metal enclosure. The method includes a first step of detecting a plurality of discharge events; and a second step of finding a time interval between the plurality of discharge events, and determining, where the discharge events occur at a time interval shorter than a prescribed threshold time, that the partial discharge has occurred within the metal enclosure, or determining, where the discharge events occur only at a time interval longer than the threshold time, that a discharge has occurred outside the metal enclosure.

An apparatus for detecting a partial discharge within electrical equipment according to this invention is an apparatus for detecting a partial discharge within electrical equipment in which a conductor is provided within a metal enclosure filled with an insulating gas, and an AC high voltage of a frequency not higher than a utility frequency is applied between the conductor and the metal enclosure, the apparatus detecting a partial discharge within the metal enclosure. The apparatus includes a discharge sensor that detects a plurality of discharge events; and a determining unit that finds a time interval between the plurality of discharge events, and determines, where the discharge events occur at a time interval shorter than a prescribed threshold time, that the partial discharge has occurred within the metal enclosure, or determines, where the discharge events occur only at a time interval longer than the threshold time, that a discharge has occurred outside the metal enclosure.

Advantageous Effects of Invention

In the method and the apparatus for detecting a partial discharge within the electrical equipment according to this invention, a time interval between a plurality of discharge events is found, and where the discharge events occur at a time interval shorter than a prescribed threshold time, it is determined that the partial discharge has occurred within the metal enclosure, or where the discharge events occur only at a time interval longer than the threshold time, it is determined that a discharge has occurred outside the metal enclosure. It is thus possible to readily distinguish between a partial discharge that occurs within the electrical equipment and a discharge that occurs outside the electrical equipment.

BRIEF DESCRIPTION OF DRAWINGS

FIG. 2 is a flowchart showing the operation of the partial discharge detection apparatus shown in FIG. 1.

FIGS. 9A, 9B are diagrams for explaining a reason why the time interval differs between a discharge in a SF6 gas and a discharge in the atmosphere.

DESCRIPTION OF EMBODIMENTS

First Embodiment

Figure 1:
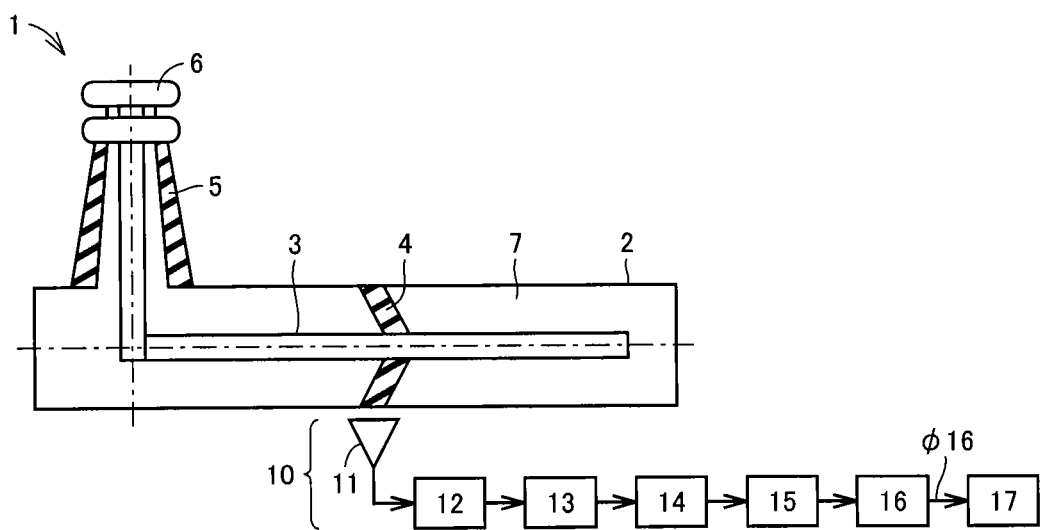
FIG. 1 is a block diagram showing the configuration of a partial discharge detection apparatus for a gas insulated switchgear according to a first embodiment of this invention.

A partial discharge detection apparatus 10 according to a first embodiment of the present invention detects a partial discharge within a gas insulated switchgear 1 (electrical equipment), as shown in FIG. 1. Gas insulated switchgear 1 includes a metal enclosure 2. Metal enclosure 2 is formed with a cylindrical shape having closed ends. A high-voltage conductor 3 is provided within metal enclosure 2. High-voltage conductor 3 is disposed coaxially with metal enclosure 2, and is supported at a central portion thereof by a support 4 formed of an insulating material. Metal enclosure 2 is grounded. An AC high voltage of the utility frequency (50 Hz or 60 Hz) is applied between high-voltage conductor 3 and metal enclosure 2.

A bushing 5 and a shield 6 are provided on one end of an outer peripheral surface of metal enclosure 2. One end of high-voltage conductor 3 is connected to an overhead wire (not shown) via bushing 5 and shield 6. Metal enclosure 2 is filled with an $SF_6$ (sulfur hexafluoride) gas 7 as an insulating gas. Instead of the $SF_6$ gas, metal enclosure 2 may be filled with nitrogen, air, $CO_2$ (carbon dioxide), a halogenated gas such as $CF_4$ (carbon tetrafluoride), or a mixed gas thereof.

Partial discharge detection apparatus 10 includes a discharge sensor 11, a demodulator 12, a peak value determination unit 13, an A/D (Analog/Digital) conversion unit 14, a digital signal processing unit 15, a discharge determination unit 16, and a notifying unit 17. As discharge sensor 11, an electromagnetic wave antenna that detects electromagnetic waves radiated from a discharge may be used, for example.

It is noted that because the frequency component of the electromagnetic waves radiated from a discharge extends over a broad band from several KHz to several GHz, frequencies without external noise need to be selected to improve the S/N (signal/noise) ratio. External electromagnetic noise tends to increase at lower frequencies and decrease at higher frequencies. It is therefore common to select, as the electromagnetic waves to be detected by the electromagnetic wave antenna, electromagnetic waves in the so-called UHF band, which is a frequency band of several hundreds of MHz or higher.

Alternatively, an AE (Acoustic Emission) sensor, a surface current sensor, a ground wire current detector, or the like that can capture a signal generated from a discharge may be used instead of the electromagnetic wave antenna.

Demodulator 12 converts an output signal of discharge sensor 11 into a waveform signal that can be readily processed by a subsequent-stage electrical circuit. Peak value determination unit 13 compares a peak value VH of an output signal of demodulator 12 with a prescribed threshold voltage Vth, and passes, among output signals of demodulator 12, only a signal with a peak value VH higher than prescribed threshold voltage Vth to the subsequent-stage circuit. A/D conversion unit 14 converts an analog signal that has passed through peak value determination unit 13 into a digital signal.

Digital signal processing unit 15 measures a time interval Ti between the digital signal from A/D conversion unit 14 and a subsequently input digital signal, and puts the occurrence frequency (times) of time intervals Ti into a histogram. Discharge determination unit 16 determines, based on the histogram created by digital signal processing unit 15, whether the discharge is a partial discharge that has occurred within metal enclosure 2 or a discharge occurred outside metal enclosure 2, and outputs a signal 416 indicating the determination result.

Specifically, discharge determination unit 16 determines whether the frequency is present within a prescribed threshold time Tth or shorter, in the histogram created by digital signal processing unit 15, and generates signal ϕ16 based on the determination result. Threshold time Tth is 100 µs.

Where the frequency is present within threshold time Tth or shorter, discharge determination unit 16 determines that a partial discharge has occurred within metal enclosure 2, and activates signal ϕ16 to the "H" level. Where the frequency is absent within threshold time Tth or shorter, that is, the frequency is present only within threshold time Tth or longer, discharge determination unit 16 determines that a discharge has occurred outside metal enclosure 2, and deactivates signal φ16 to the "L" level. The relationship between the discharge and the presence or absence of the frequency within threshold time Tth or shorter will be described in detail below.

Where signal φ16 is activated to the "H" level, notifying unit 17 notifies a user of gas insulated switchgear 1 that a partial discharge has occurred within metal enclosure 2. Methods of notification may include displaying a text, an image, or the like on the monitor screen, notifying the user through a sound using a buzzer or the like, and notifying the user through light using a lamp or the like.

FIG. 2 is a flowchart showing the operation of partial discharge detection apparatus 10. In step S1, a discharge is detected by discharge sensor 11. In step S2, an output signal of discharge sensor 11 is detected by demodulator 12, and is converted into a waveform signal that can be readily processed by the electrical circuit. In step S3, peak value determination unit 13 determines whether or not peak value VH of the output signal of demodulator 12 is higher than prescribed threshold voltage Vth. Where VH>Vth does not hold, the operation returns to step S1, and where Vh>Vth, the operation proceeds to step S4.

In step S4, the signal that has passed through peak value determination unit 13 is converted into a digital signal by A/D conversion unit 14, and, based on the digital signal, time interval Ti between two consecutive discharges is measured by digital signal processing unit 15. In step S5, the frequency of time intervals Ti is put into a histogram by digital signal processing unit 15.

In step S6, discharge determination unit 16 determines whether or not the frequency is present within threshold time Tth or shorter in the histogram. Where the frequency is absent, the operation returns to step S1, and where the frequency is present, the operation proceeds to step S7. Threshold time Tth is 100 µs. In step S7, notifying unit 17 notifies the user of gas insulated switchgear 1 that a partial discharge has occurred within metal enclosure 2, that is, the possibility of a breakdown is high. In response to this, the user performs maintenance of gas insulated switchgear 1.

Next, a discharge that occurs in gas insulated switchgear 1 will be described. A discharge as a single event is a rapid phenomenon that occurs as a pulse within several ns to several tens of ns from its occurrence to extinction. Discharges can also be characterized in that under some conditions, they may occur consecutively at a time interval Ti of several µs or shorter to several ms. Time interval Ti between discharges varies depending on the discharge source. Further, discharges occur in conjunction with an applied voltage, and are typically repeated in synchronization with the voltage phase, at substantially the same phase angle. Since an applied voltage of 50 Hz to 60 Hz is commonly employed, the time of one voltage period is from about 16 ms to 20 ms.

Figure 3A:
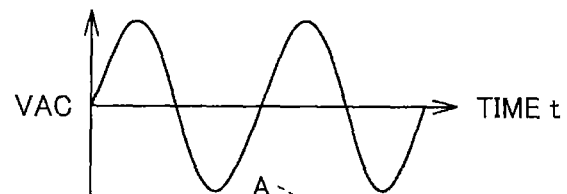
FIGS. 3A-3C are time charts showing the relationship between partial discharge and AC voltage applied to the high-voltage conductor shown in FIG. 1.
Figure 3B:
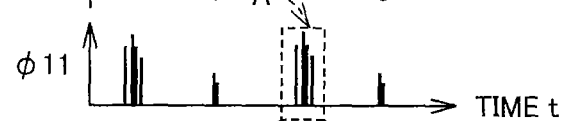
Figure 3C:
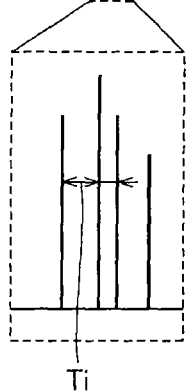

FIG. 3A is a time chart showing the waveform of an AC voltage VAC applied to high-voltage conductor 3, FIG. 3B is a time chart showing an output signal φ11 of discharge sensor 11, and FIG. 3K is an enlarged view of portion A in FIG. 3B. In FIGS. 3A to 3C two periods of AC voltage VAC are shown, and AC voltage VAC changes sinusoidally. A single discharge event is observed in a pulse-like waveform, and a discharge pulse is observed at a particular phase angle of the applied voltage VAC. In FIGS. 3A to 3C, partial discharges that occur near the maximum voltage of AC voltage VAC are shown. The phase angle at which the partial discharges occur in conjunction with AC voltage VAC varies depending on the discharge source.

Figure 4:
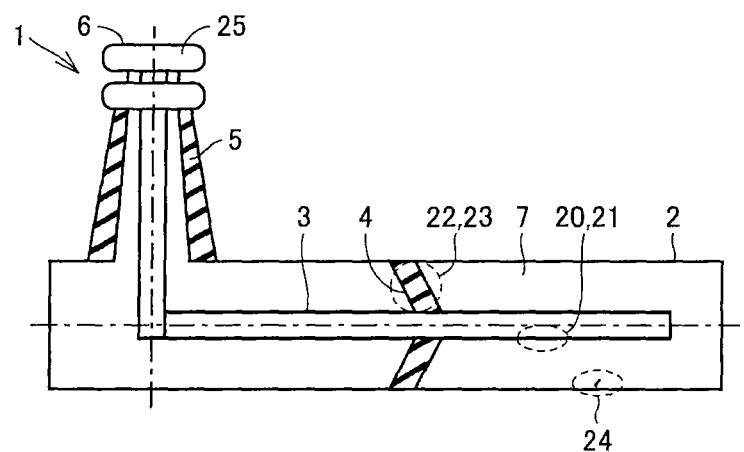
FIG. 4 is a diagram showing discharge sources that may cause discharges in the gas insulated switchgear shown in FIG. 1.

FIG. 4 is a diagram showing discharge sources 20 to 25 that may cause discharges in gas insulated switchgear 1. In FIG. 4, the discharge sources that may cause partial discharges in gas insulated switchgear 1 are, for example, a projection (high-voltage protrusion) 20 on high-voltage conductor 3, a floating electrode 21 that is electrically disconnected from high-voltage conductor 3 although it adheres to high-voltage conductor 3, an internal defect 22 of support 4, a defect (creepage surface defect) 23 on the creepage surface of support 4, and metal foreign matter 24 included in the $SF_6$ gas. The discharge source that may cause an external discharge in gas insulated switchgear 1 is a protrusion (shield protrusion) 25 on shield 6 attached on the end of bushing 5.

When the discharge sources are of clearly different types, it is possible to identify the type of the discharge source from the characteristics of discharges that occur in conjunction with the applied voltage period. If, however, the discharge sources are similar in type, as in the case with high-voltage protrusion 20 and shield projection 25, it is difficult to distinguish between them from the characteristics of discharges that occur in conjunction with the applied voltage period. Using the characteristics of time interval Ti between discharges, it is possible to distinguish between high-voltage protrusion 20 and shield projection 25.

As shown in FIGS. 3A to 3C, a plurality of partial discharges typically occur within a half-period of AC voltage VAC. The discharge time interval Ti herein refers to a time difference between two partial discharges that emerge within the half-period of AC voltage VAC. Although the definition of the time difference also includes a time interval Ti equivalent to the half-period of AC voltage VAC, the occurrence frequency of such a time interval Ti is low, while the occurrence frequency of a time interval Ti between partial discharges occurring within the half-period of the voltage phase is high.

Figure 5:
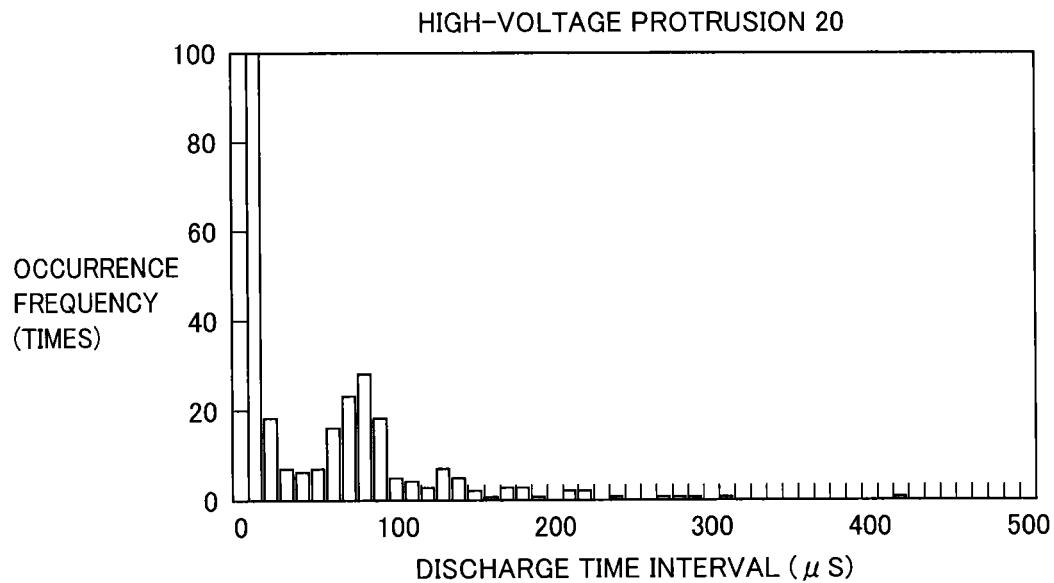
FIG. 5 is a histogram showing the frequency of time intervals between discharges that occur at the high-voltage protrusion shown in FIG. 4.
Figure 6:
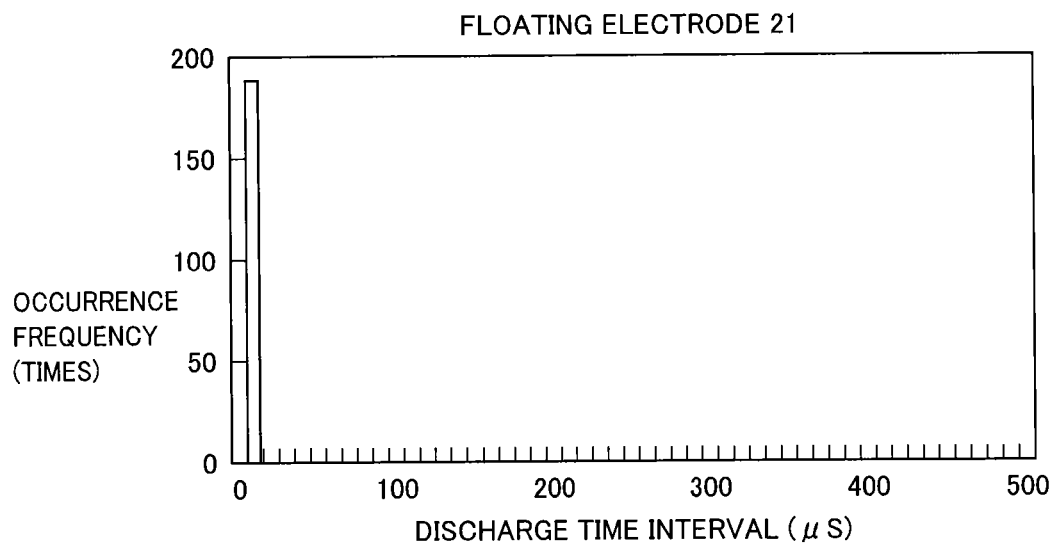
FIG. 6 is a histogram showing the frequency of time intervals between discharges that occur at the floating electrode shown in FIG. 4.
Figure 7:
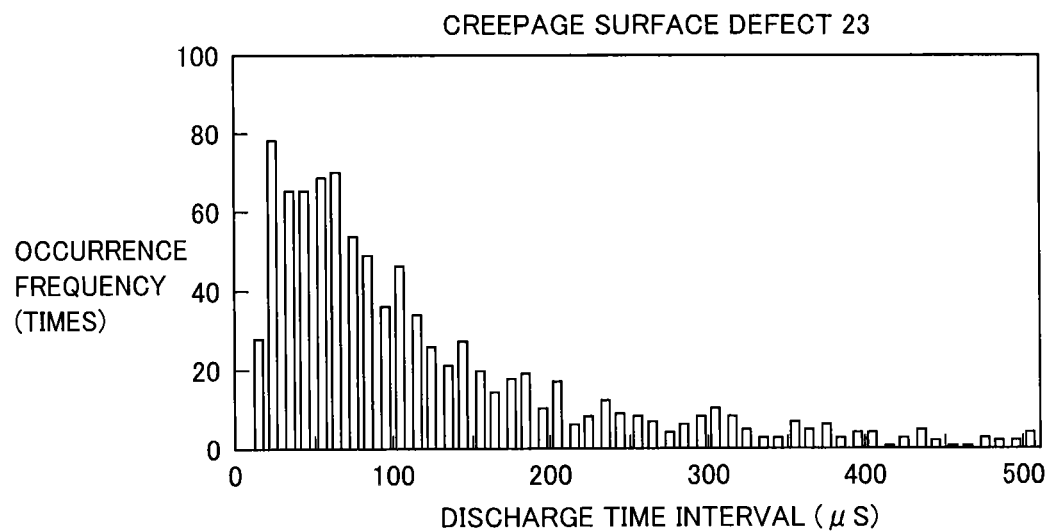
FIG. 7 is a histogram showing the frequency of time intervals between discharges that occur at the creepage surface defect shown in FIG. 4.
Figure 8:
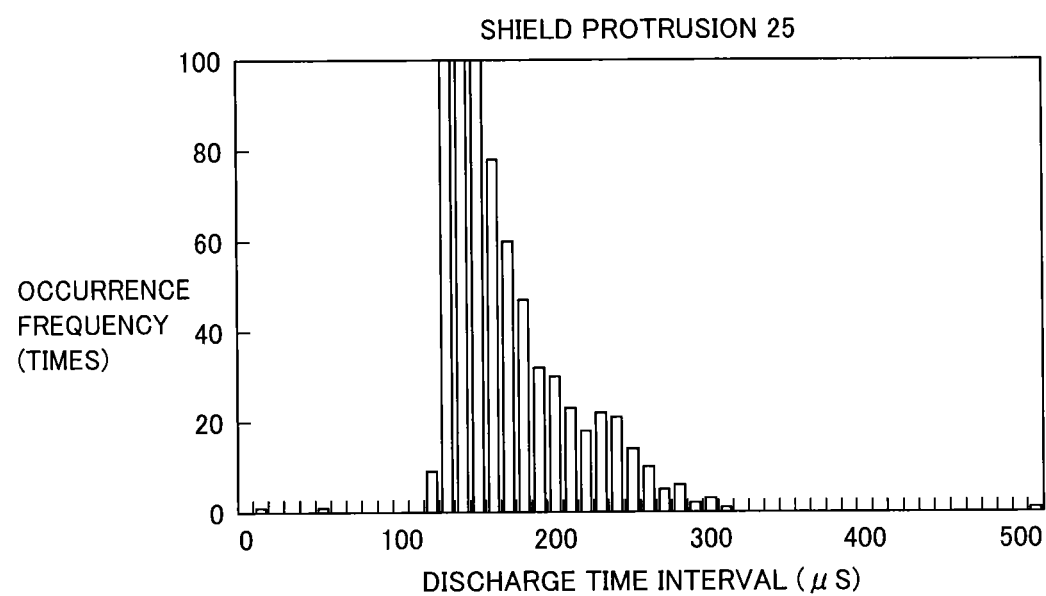
FIG. 8 is a histogram showing the frequency of time intervals between discharges that occur at the shield protrusion shown in FIG. 4.

FIGS. 5 to 8 show histograms each showing the frequency of time intervals Ti between discharges that occur at high-voltage protrusion 20, floating electrode 21, creepage surface defect 23, and shield projection 25, respectively. FIGS. 5 to 7 show discharges that occur in the $SF_6$ gas, while FIG. 8 shows discharges that occur in the atmosphere. While each of the histograms shown in FIGS. 5 to 8 has its characteristics, it is seen that the frequency emerges from near several µs in the case of discharges in the $SF_6$ gas (FIGS. 5 to 7), while the frequency does not emerge until about 100 µs or longer in the case of discharges in the atmosphere.

Thus, the use of the characteristics shown in FIGS. 5 to 8 allows a discharge in the $SF_6$ gas and a discharge in the atmosphere to be distinguished from each other, by measuring time intervals Ti between discharges, creating a histogram showing the frequency of time intervals Ti, and setting threshold time Tth to 100 µs. That is, where the discharge frequency is detected only within 100 µs or shorter, or where the discharge frequency is detected both within 100 µs or longer and 100 µs or shorter, it can be determined that a partial discharge has occurred in the $SF_6$ gas (within metal enclosure 2). Where the discharge frequency is detected only within 100 µs or longer, it can be determined that a discharge has occurred in the atmosphere (outside metal enclosure 2). A notification can therefore be provided only where a partial discharge has occurred within metal enclosure 2.

Next, a reason why time interval Ti between discharges varies depending on the type of the gas generated from the discharge will be described. FIG. 9A schematically shows the state of a partial discharge in the $SF_6$ gas, and FIG. 9B schematically shows the state of a discharge in the atmosphere. In both cases shown in FIGS. 9A and 9B a forward end of a rod electrode 30 is opposed to the surface of a plate electrode 31 with a prescribed gap there between, and AC voltage VAC is applied between a rod electrode 30 and plane electrode 31 to cause a partial discharge at the tip end of rod electrode 30. As can be seen from FIGS. 9A and 9B, a partial discharge formation region 33 in the atmosphere is larger than a partial discharge formation region 32 in the $SF_6$ gas.

How the partial discharges occur is now described. In a gas, a certain proportion of electrons are present which are ionized from the gas molecule due to the collision energy of cosmic rays, for example. When a voltage is applied to rod electrode 30, such electrons are accelerated by an electric field and collide with the gas molecule to cause an electron avalanche that increases electrons. When the electron avalanche grows to a certain size, a discharge referred to as the streamer discharge occurs. This discharge is the partial discharge. The conditions for formation of the streamer discharge are represented by the following equation (1):

[Equation 1]

$$\ln N = \int_0^{X_c} \left\{\frac{\alpha - \eta}{p}\right\} dx = K \quad (1)$$

where N is the number of electrons, Xc is the distance of the electron avalanche created, α is the ionization coefficient, η is the electron attachment coefficient, x is the distance, K is a constant from 10 to 13, and p is the gas pressure. (α−η)/p varies depending on the type of the gas. In the case of the $SF_6$ gas, for example, (α−ι)/p is represented by the following equation (2):

$$(\alpha-\eta)/p=27.7(E/p-88.9) \quad (2)$$

In the case of the atmosphere, (α−η)/p is represented by the following equation (3):

$$(\alpha-\eta)/p=0.211(E/p-24.0)^2 \quad (3)$$

In the foregoing equations, gas pressure p is indicated in atm, E is the electric field, and electric field E is indicated in kV/cm.

Distance Xc in the formation conditions varies depending on the type of the gas: in the $SF_6$ gas, distance Xc is calculated to be several tens of m; and in the atmosphere, distance Xc is calculated to be several mm. The distance of the streamer discharge formed is longer in the atmosphere than in the $SF_6$ gas, and hence, the region of the partial discharge in the atmosphere is naturally also larger as shown in FIGS. 9(a) and (b). Since the streamer discharge is formed along the line of electric force, in the case of rod electrode 30, it is formed around the end thereof, as shown in FIGS. 9(a) and (b).

After the occurrence of the streamer discharge or electron avalanche, in a non-uniform electric field in which a partial discharge occurs, the electric field also abruptly decreases, which causes the streamer discharge or electron avalanche to stop proceeding. Thereafter, the created ions remain in the space, which relaxes the electric field, such that a subsequent partial discharge cannot be formed immediately. This results in time interval Ti between discharges.

The ions responsible for the electric field relaxation diffuse due to thermal motion, or drift due to the electric field, which enhanced the electric field with the passage of time. Hence, if voltage VAC is applied to rod electrode 30 after the previous discharge has stopped, a subsequent discharge will occur. In terms of the diffusion velocity due to thermal motion and the drift velocity due to an electric field, air molecules are faster than the $SF_6$ molecule. Their velocity ratio, however, is only about twice as high, and the time until the initiation of the subsequent discharge is more affected by the size of the space of the ions in which the electric field concentration does not occur. As a result, as described earlier, more time is required for a discharge in the atmosphere. Hence, as shown in FIGS. 5 to 8, time interval Ti between discharges in the $SF_6$ gas is shorter than time interval Ti between discharges in the atmosphere.

As described above, according to the first embodiment, the type of the partial discharge can be identified, and, for example, the type of the gas in which the discharge is occurring can be identified. This allows a discharge in the $SF_6$ gas and a discharge in the atmosphere to be distinguished from each other, allowing a partial discharge within metal enclosure 2 and a discharge outside metal enclosure 2 to be distinguished from each other. As a result, a malfunction of partial discharge detection apparatus 10 caused by an external discharge can be prevented, leading to improved reliability of partial discharge detection apparatus 10.

Further, it is possible to readily distinguish between a partial discharge that occurs within the electrical equipment and a discharge that occurs outside the electrical equipment, compared to PTD 2 in which a correlation diagram between the voltage phase angle of a partial discharge and the time interval is created, and, based on the pattern of the correlation diagram, a partial discharge within the electrical equipment and external noise are distinguished from each other.

Second Embodiment

Figure 10:
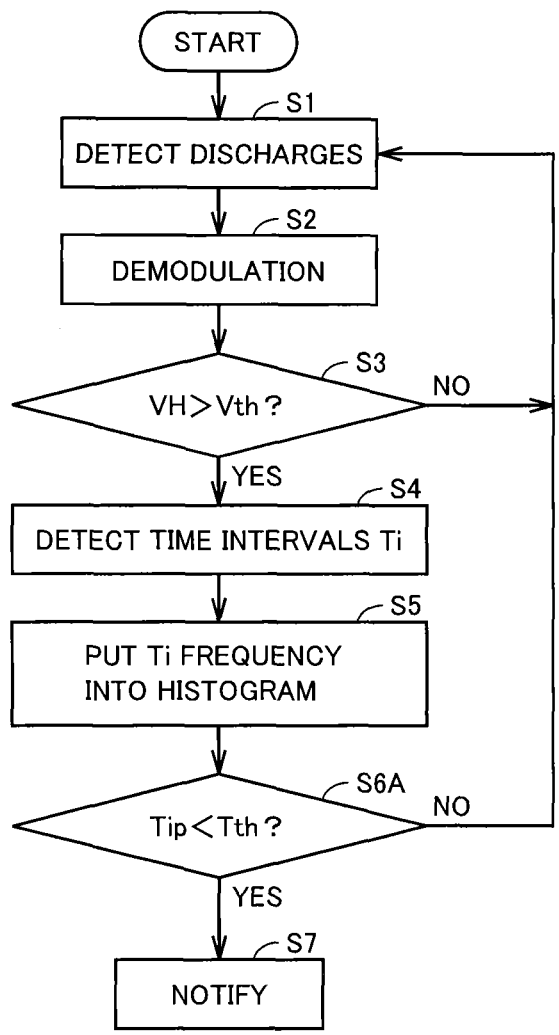
FIG. 10 is a flowchart showing the operation of a partial discharge detection apparatus according to a second embodiment of this invention.

FIG. 10 is a flowchart for comparison with FIG. 2, showing the operation of a partial discharge detection apparatus according to a second embodiment of this invention. The flowchart of FIG. 10 differs from that of FIG. 1 in that step S6 is replaced with step S6A.

In step S6A, it is determined whether or not a peak value Tip of time intervals Ti in the histogram is smaller than a threshold time Tth (=100 μs). Where Tip>Tth, it is determined that a discharge has occurred in the atmosphere, and the operation returns to step S1. Where Tip<Tth, it is determined that a partial discharge has occurred in the $SF_6$ gas, and the operation proceeds to step S7. In step S7, the user is notified that a partial discharge has occurred within metal enclosure 2.

As can be seen in FIGS. 5 to 8, in the case of any type of discharge source, the occurrence frequency of discharge time intervals Ti has peak value Tip. According to the second embodiment, it is possible to distinguish between a partial discharge within metal enclosure 2 and a discharge outside metal enclosure 2, based on peak value Tip of time intervals in the histogram, allowing them to be readily and accurately distinguished from each other.

Third Embodiment

Figure 11:
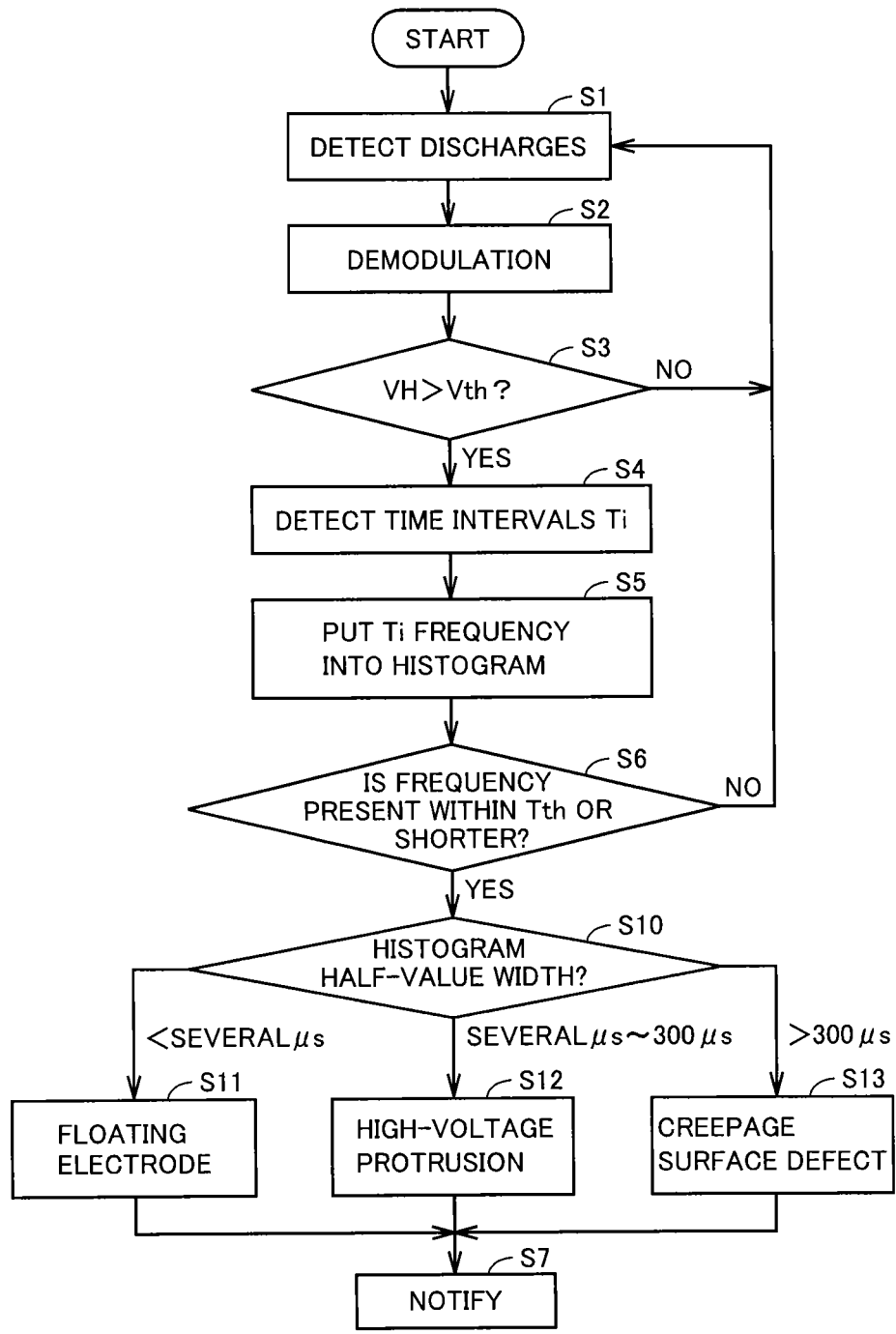
FIG. 11 is a flowchart showing the operation of a partial discharge detection apparatus according to a third embodiment of this invention.

FIG. 11 is a flowchart for comparison with FIG. 2, showing the operation of a partial discharge detection apparatus according to a third embodiment of this invention. The flowchart of FIG. 11 differs from that of FIG. 2 by including additional steps S10 to S13 between step S6 and S7.

In step S10, a half-value width showing variations in the histogram is detected, and it is determined which of the three ranges the half-value width falls within, i.e., a first range whose half-value width is smaller than several μs, a second range whose half-value width is from several μs to 300 μs, and a third range whose half-value width is greater than 300 μs. Using the characteristics shown in FIGS. 5 to 7, for example, where the half-value width falls within the first range, it is determined in step S11 that a partial discharge has occurred at floating electrode 21, and then the user is notified of this in step S7. Where the half-value width falls within the second range, it is determined in step S12 that a partial discharge has occurred at high-voltage protrusion 20, and then the user is notified of this in step S7. Where the half-value width falls within the third range, it is determined in step S13 that a partial discharge has occurred at creepage surface defect 23, and then the user is notified of this in step S7.

According to the third embodiment, the discharge source within metal enclosure 2 (the cause of the discharge) can be identified based on the half-value width of the histogram. As a result, a defective portion can be identified, leading to a significantly shortened time for repair of the portion with poor insulation. Thus, a more advanced, higher-reliability partial discharge detection apparatus can be achieved.

While the foregoing first to third embodiments have described the case where the electrical equipment is gas insulated switchgear 1, the electrical equipment may also be a gas insulating transformer or other equipment.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1: gas insulated switchgear; 2: metal enclosure; 3: high-voltage conductor; 4: support; 5: bushing; 6: shield; 7: $SF_6$ gas; 10: partial discharge detection apparatus; 11: discharge sensor; 12: demodulator; 13: peak value determination unit; 14: A/D conversion unit; 15: digital signal processing unit; 16: discharge determination unit; 17: notifying unit; 20: high-voltage protrusion; 21: floating electrode; 22: internal defect; 23: creepage surface defect; 24: metal foreign matter; 25: shield projection; 30: rod electrode; 31: plate electrode; 32, 33: partial discharge formation region.

The invention claimed is:
1. A method for detecting a partial discharge within electrical equipment in which a conductor is provided within a metal enclosure filled with an insulating gas, and an alternating current (AC) high voltage of a frequency not higher than a utility frequency is applied between the conductor and the metal enclosure, the method detecting a partial discharge within the metal enclosure, the method comprising:
  detecting a plurality of discharge events;
  finding a time interval between each two consecutive discharge events of the plurality of discharge events;
  determining:
    when at least one of the time intervals is shorter than a threshold time defined between a discharge time interval in a $SF_6$ gas and a discharge time interval in the atmosphere, that the partial discharge has occurred within the metal enclosure, and
    when each of the time intervals is longer than the threshold time, that a discharge has only occurred outside the metal enclosure; and
  notifying a user that the partial discharge has occurred within the metal enclosure upon determination that the partial discharge has occurred within the metal enclosure.

2. The method for detecting a partial discharge within the electrical equipment according to claim 1, the method further comprising:
  creating a histogram showing occurrence frequencies of time intervals between each two consecutive discharge events of the plurality of discharge events;
  when it is determined that the partial discharge has occurred within the metal enclosure, finding a half-value of the histogram as a width of variation in occurrence frequencies of the time interval;
  when the half-value width falls within a first range, determining that a cause of the partial discharge is a first discharge source; and
  when the half-value width falls within a second range, determining that the cause is a second discharge source.

3. The method for detecting a partial discharge within the electrical equipment according to claim 1, wherein the threshold time is 100 μs.

4. The method for detecting a partial discharge within the electrical equipment according to claim 1, wherein the threshold is a lower limit of the discharge time interval in the atmosphere.

5. A method for detecting a partial discharge within electrical equipment in which a conductor is provided within a metal enclosure filled with an insulating gas, and an alternating current (AC) high voltage of a frequency not higher than a utility frequency is applied between the conductor and the metal enclosure, the method detecting a partial discharge within the metal enclosure, the method comprising:
  detecting a plurality of events;
  finding a peak value of occurrence frequencies of time intervals between each two consecutive discharge events of the plurality of discharge events;
  determining:
    when the peak value is present within a time interval shorter than a threshold time defined between a discharge time interval in a $SF_6$ gas and a discharge time interval in the atmosphere, that the partial discharge has occurred within the metal enclosure, and
    when the peak value is present only within a time interval longer than the threshold time, that a discharge has occurred outside the metal enclosure; and
  notifying a user that the partial discharge has occurred within the metal enclosure upon determination that the partial discharge has occurred within the metal enclosure.

6. The method for detecting a partial discharge within the electrical equipment according to claim 5, wherein the threshold is a lower limit of the discharge time interval in the atmosphere.

7. An apparatus for detecting a partial discharge within electrical equipment in which a conductor is provided within a metal enclosure filled with an insulating gas, and an alternating current (AC) high voltage of a frequency not higher than a utility frequency is applied between the conductor and the metal enclosure, the apparatus detecting a partial discharge within the metal enclosure, the apparatus comprising:
  a discharge sensor configured to detect a plurality of discharge events; and
  circuitry configured to:

find a time interval between each two consecutive discharge events of the plurality of discharge events;
determine:
when at least one of the time intervals is shorter than a threshold time defined between a discharge time interval in a $SF_6$ gas and a discharge time interval in the atmosphere, that the partial discharge has occurred within the metal enclosure, and
when each of the time intervals is longer than the threshold time, that a discharge has only occurred outside the metal enclosure; and
notify a user that the partial discharge has occurred within the metal enclosure upon determination that the partial discharge has occurred within the metal enclosure.

8. The apparatus for detecting a partial discharge within the electrical equipment according to claim 7, wherein
the circuitry is further configured to:
create a histogram showing occurrence frequencies of time intervals between each two consecutive discharge events of the plurality of discharge events;
when the circuitry determines that the partial discharge has occurred within the metal enclosure, find a half-value of the histogram as a width of variation in the occurrence frequency of the time interval between the plurality of discharge events;
when the half-value width falls within a first range, determine that a cause of the partial discharge is a first discharge source; and
when the half-value width falls within a second range, determine that the cause is a second discharge source.

9. The apparatus for detecting a partial discharge within the electrical equipment according to claim 7, wherein the threshold time is 100 µs.

10. The apparatus for detecting a partial discharge within the electrical equipment according to claim 7, wherein the threshold is a lower limit of the discharge time interval in the atmosphere.

11. An apparatus for detecting a partial discharge within electrical equipment in which a conductor is provided with a metal enclosure filled with an insulating gas, and an alternating current (AC) high voltage of a frequency not higher than a utility frequency is applied between the conductor and the metal enclosure, the apparatus detecting a partial discharge within the metal enclosure, the apparatus comprising:
a discharge sensor configured to detect a plurality of discharge events; and
circuitry configured to:
find a peak value of occurrence frequencies of time intervals between each two consecutive discharge events of the plurality of discharge events, and
determine:
when the peak value is present within a time interval shorter than a threshold time defined between a discharge time interval in a $SF_6$ gas and a discharge time interval in the atmosphere, that the partial discharge has occurred within the metal enclosure, and
when the peak value is present only within a time interval longer than the threshold time, that a discharge has occurred outside the metal enclosure; and
notify a user that the partial discharge has occurred within the metal enclosure upon determination that the partial discharge has occurred within the metal enclosure.

12. The apparatus for detecting a partial discharge within the electrical equipment according to claim 11, wherein the threshold is a lower limit of the discharge time interval in the atmosphere.

* * * * *